US012663567B2

(12) United States Patent
Vartiainen

(10) Patent No.: US 12,663,567 B2
(45) Date of Patent: Jun. 23, 2026

(54) METHOD FOR FABRICATING A BLAZED GRATING

(71) Applicant: DISPELIX OY, Espoo (FI)

(72) Inventor: Ismo Vartiainen, Helsinki (FI)

(73) Assignee: DISPELIX OY (FI)

(*) Notice: Subject to any disclaimer, the term of this patent is extended or adjusted under 35 U.S.C. 154(b) by 219 days.

(21) Appl. No.: 18/560,321

(22) PCT Filed: May 11, 2022

(86) PCT No.: PCT/FI2022/050316
§ 371 (c)(1),
(2) Date: Nov. 10, 2023

(87) PCT Pub. No.: WO2022/243598
PCT Pub. Date: Nov. 24, 2022

(65) Prior Publication Data
US 2024/0241296 A1 Jul. 18, 2024

(30) Foreign Application Priority Data
May 17, 2021 (FI) .................................... 20215575

(51) Int. Cl.
*G02B 5/18* (2006.01)
*C23C 16/02* (2006.01)
(Continued)

(52) U.S. Cl.
CPC ........ *G02B 5/1857* (2013.01); *C23C 16/0245* (2013.01); *C23C 16/045* (2013.01); *C23C 16/45555* (2013.01); *C23C 16/56* (2013.01)

(58) Field of Classification Search
None
See application file for complete search history.

(56) References Cited

U.S. PATENT DOCUMENTS 3,944,420 A 3/1976 Gale et al.
4,057,326 A 11/1977 Knop
(Continued)

FOREIGN PATENT DOCUMENTS

CA 2214927 4/1999
CN 1116719 A 2/1996
(Continued)

OTHER PUBLICATIONS

DAVID: Fabrication of Stair-case profiles with high aspect ratios for blazed diffractive optical elements, Microelectronic Engineering, 2000, vol. 53, pp. 677-680.
(Continued)

*Primary Examiner* — Roberts P Culbert
(74) *Attorney, Agent, or Firm* — Edmonds & Cmaidaika, P.C.

(57) ABSTRACT

This disclosure relates to a method (100) for fabricating a blazed grating. The method (100) comprises providing a substrate and a patterned mask layer (110) on the substrate, performing primary dry etching (120) of the substrate such that primary ions are accelerated towards a primary etch direction to impinge on the substrate, and performing secondary dry etching (150) of the substrate such that secondary ions are accelerated towards a secondary etch direction to impinge on the substrate. A primary projection of the primary etch direction and a secondary projection of the secondary etch direction onto the grating cross-sectional plane extend perpendicular to one and the other of a blaze facet direction and an anti-blaze facet direction, respectively, and ions accelerated towards a direction with a projection onto a grating cross-sectional plane perpendicular to the blaze facet direction are collimated to form a collimated ion beam for etching the substrate.

10 Claims, 7 Drawing Sheets

(51) Int. Cl.
  *C23C 16/04*    (2006.01)
  *C23C 16/455*   (2006.01)
  *C23C 16/56*    (2006.01)

(56)         References Cited

U.S. PATENT DOCUMENTS

| | | | |
|---|---|---|---|
| 4,294,913 A | 10/1981 | Moraw et al. | |
| 4,609,259 A | 9/1986 | Suemitsu et al. | |
| 5,113,288 A | 5/1992 | Ohshita | |
| 5,828,492 A | 10/1998 | Moser et al. | |
| 5,907,436 A | 5/1999 | Perry et al. | |
| 6,071,652 A | 6/2000 | Feldman et al. | |
| 6,475,704 B1 | 11/2002 | Iwasaki et al. | |
| 6,545,808 B1 | 4/2003 | Ehbets et al. | |
| 7,972,959 B2 | 7/2011 | Mebarki et al. | |
| 8,765,360 B2 | 7/2014 | Wang et al. | |
| 9,791,623 B2 | 10/2017 | Magnusson et al. | |
| 10,598,832 B2 * | 3/2020 | Evans | G11B 7/1372 |
| 10,649,141 B1 | 5/2020 | Colburn et al. | |
| 10,761,334 B2 * | 9/2020 | Evans | G02B 5/1842 |
| 11,175,455 B1 | 11/2021 | Colburn et al. | |
| 11,226,439 B2 * | 1/2022 | Olson | G02B 5/1857 |
| 11,226,441 B2 * | 1/2022 | Evans | G02B 5/1828 |
| 11,247,298 B2 * | 2/2022 | Evans | B23K 26/34 |
| 11,512,385 B2 * | 11/2022 | Olson | G03F 7/24 |
| 12,169,359 B2 * | 12/2024 | Sturland | B81C 1/00523 |
| 2002/0122255 A1 | 9/2002 | Ogusu et al. | |
| 2003/0022070 A1 | 1/2003 | Lee et al. | |
| 2003/0044728 A1 | 3/2003 | Terada et al. | |
| 2004/0017989 A1 | 1/2004 | So | |
| 2004/0020892 A1 | 2/2004 | Matthews et al. | |
| 2004/0104449 A1 | 6/2004 | Yoon et al. | |
| 2005/0130072 A1 | 6/2005 | Koeda | |
| 2006/0151435 A1 | 7/2006 | Taniguchi | |
| 2006/0178074 A1 | 8/2006 | Park et al. | |
| 2008/0078741 A1 | 4/2008 | Kotani | |
| 2009/0023011 A1 | 1/2009 | Chaffins et al. | |
| 2009/0053655 A1 | 2/2009 | Deng et al. | |
| 2009/0231702 A1 | 9/2009 | Wu et al. | |
| 2010/0134534 A1 | 6/2010 | Seesselberg et al. | |
| 2011/0123771 A1 | 5/2011 | Stavis et al. | |
| 2011/0255162 A1 | 10/2011 | Wu et al. | |
| 2013/0027776 A1 | 1/2013 | Wu et al. | |
| 2013/0170043 A1 | 7/2013 | Ko | |
| 2013/0215406 A1 | 8/2013 | Heussler et al. | |
| 2014/0353141 A1 * | 12/2014 | Liu | C23C 14/00 204/192.34 |
| 2015/0048047 A1 * | 2/2015 | Liu | G02B 5/1857 216/24 |
| 2015/0068599 A1 | 3/2015 | Chou et al. | |
| 2016/0033784 A1 | 2/2016 | Levola et al. | |
| 2016/0047961 A1 | 2/2016 | Park et al. | |
| 2016/0118295 A1 | 4/2016 | Chan et al. | |
| 2016/0308020 A1 | 10/2016 | Sreenivasan et al. | |
| 2017/0123208 A1 | 5/2017 | Vallius | |
| 2017/0307887 A1 | 10/2017 | Stenberg et al. | |
| 2017/0315346 A1 | 11/2017 | Tervo et al. | |
| 2018/0031744 A1 | 2/2018 | Miller et al. | |
| 2018/0040654 A1 | 2/2018 | Christophersen et al. | |
| 2018/0095201 A1 * | 4/2018 | Melli | G02B 27/0172 |
| 2018/0269247 A1 | 9/2018 | Kumai et al. | |
| 2018/0341090 A1 | 11/2018 | Devlin et al. | |
| 2020/0018985 A1 | 1/2020 | Evans et al. | |
| 2020/0033604 A1 * | 1/2020 | Schmulen | G02B 6/00 |
| 2020/0066629 A1 | 2/2020 | Schenker et al. | |
| 2021/0349252 A1 * | 11/2021 | Mohanty | G02B 6/0016 |
| 2022/0397708 A1 * | 12/2022 | Rivera | G02B 5/1857 |

FOREIGN PATENT DOCUMENTS

| | | |
|---|---|---|
| CN | 1797199 A | 7/2006 |
| CN | 101171534 A | 4/2008 |
| CN | 101986173 A | 3/2011 |
| CN | 103901520 A1 | 7/2014 |
| CN | 104459862 A | 3/2015 |
| CN | 106662684 A | 5/2017 |
| CN | 105785493 B | 1/2019 |
| EP | 1930776 A1 | 7/2008 |
| EP | 1942364 A | 7/2008 |
| GB | 1362418 A | 8/1974 |
| JP | H04186829 | 7/1982 |
| JP | S6033504 | 2/1985 |
| JP | S60188909 A | 9/1985 |
| JP | S6242103 | 2/1987 |
| JP | 5634205 A | 1/1988 |
| JP | H1078667 A | 3/1988 |
| JP | S63168601 A | 7/1988 |
| JP | 01015705 A | 1/1989 |
| JP | 06-25850 | 9/1994 |
| JP | H062585510 | 9/1994 |
| JP | 1131863 A | 2/1999 |
| JP | H11160510 A | 6/1999 |
| JP | 2000155207 A | 6/2000 |
| JP | 2000258608 A | 9/2000 |
| JP | 2001004821 | 1/2001 |
| JP | 20011290015 A | 10/2001 |
| JP | 2001343512 | 12/2001 |
| JP | 2004062200 A | 2/2004 |
| JP | 2005517973 A | 6/2005 |
| JP | 20052021104 A | 7/2005 |
| JP | 2006017778 A | 1/2006 |
| JP | 2007057622 A | 3/2007 |
| JP | 20072122575 | 8/2007 |
| JP | 2007328096 A | 12/2007 |
| JP | 2008089923 A | 4/2008 |
| JP | 2009524229 A | 6/2009 |
| JP | A2009230017 | 10/2009 |
| JP | 2011000172 A | 1/2011 |
| JP | 2011215267 A | 10/2011 |
| JP | 2012013930 A | 1/2012 |
| JP | 201564426 A | 4/2015 |
| KR | 2015033561 A | 4/2015 |
| TW | 1201017232 A | 5/2010 |
| WO | 200206860 A1 | 1/2002 |
| WO | 2009005822 A1 | 1/2009 |
| WO | 2016185602 A1 | 11/2016 |
| WO | 2017091738 A1 | 6/2017 |
| WO | WO2017176921 A1 | 10/2017 |
| WO | WO2019108379 | 6/2019 |
| WO | WO2020185954 A1 | 9/2020 |

OTHER PUBLICATIONS

Finnish Patent Office Search Report dated Dec. 8, 2021, for corresponding U.S. Appl. No. 20/215,575.

International Search Report dated Jul. 20, 2022, for corresponding PCT/FI2022/050316.

* cited by examiner

METHOD FOR FABRICATING A BLAZED GRATING

CROSS REFERENCE TO RELATED APPLICATION

This patent application claims the benefit and priority of International Application No. PCT/FI2022/050316 filed on May 17, 2021, the disclosure of which is incorporated by reference herein in its entirety.

FIELD OF TECHNOLOGY

This disclosure concerns diffraction gratings. In particular, this disclosure concerns blazed gratings.

BACKGROUND

An ordinary surface-relief diffraction grating, a so-called binary grating, comprises a plurality of ridges and grooves, wherein the tops of the ridges and the bottoms of the grooves extend parallel to each other. Well-known manufacturing processes exist for fabricating such binary gratings. In case of such binary gratings, normally incident light is diffracted such that equal diffraction efficiencies are produced in both negative and positive diffraction orders. This effect arises from the mirror symmetry of the cross-sectional profiles of binary gratings.

In many applications, for example, in many waveguide-based display structures, diffraction preferentially toward one or more specific diffraction orders may be desirable and diffraction into other diffraction orders may be considered optical loss. To direct light preferentially toward specific diffraction orders, gratings with non-mirror symmetric cross-sectional profiles must be used. One example of such non-symmetric gratings is the so-called blazed grating with a triangular or saw-tooth-shaped cross-sectional profile.

Typically, blazed gratings are manufactured using processes based on grayscale lithography. Although such processes have been refined to yield gratings with acceptable characteristics, the features, especially, the apexes, of blazed gratings produced using grayscale lithography are generally relatively rounded due to the low contrast of typical grayscale lithography resists. Such deviation from ideal blazed profiles may reduce the diffraction efficiency of blazed gratings produced using grayscale lithography and/or increase the optical scattering caused by such gratings.

In light of the above, it may be desirable to develop new solutions related to blazed gratings.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

In this specification, a method for fabricating a blazed grating comprising a ridge having a blaze facet facing a blaze facet direction and an anti-blaze facet facing an anti-blaze facet direction, the blaze facet direction and the anti-blaze facet direction extending along a grating cross-sectional plane, is provided. The method comprises providing a substrate and a patterned mask layer on the substrate, performing primary dry etching of the substrate such that primary ions are accelerated towards a primary etch direction to impinge on the substrate, and performing secondary dry etching of the substrate such that secondary ions are accelerated towards a secondary etch direction to impinge on the substrate.

A primary projection of the primary etch direction onto the grating cross-sectional plane and a secondary projection of the secondary etch direction onto the grating cross-sectional plane extend perpendicular to one and the other of the blaze facet direction and the anti-blaze facet direction, respectively, and ions (of the primary ions and the secondary ions) accelerated towards a direction with a projection onto the grating cross-sectional plane perpendicular to the blaze facet direction are collimated to form a collimated ion beam for etching the substrate.

BRIEF DESCRIPTION OF THE DRAWINGS

The present disclosure will be better understood from the following detailed description read in light of the accompanying drawings, wherein.

Figure 1:
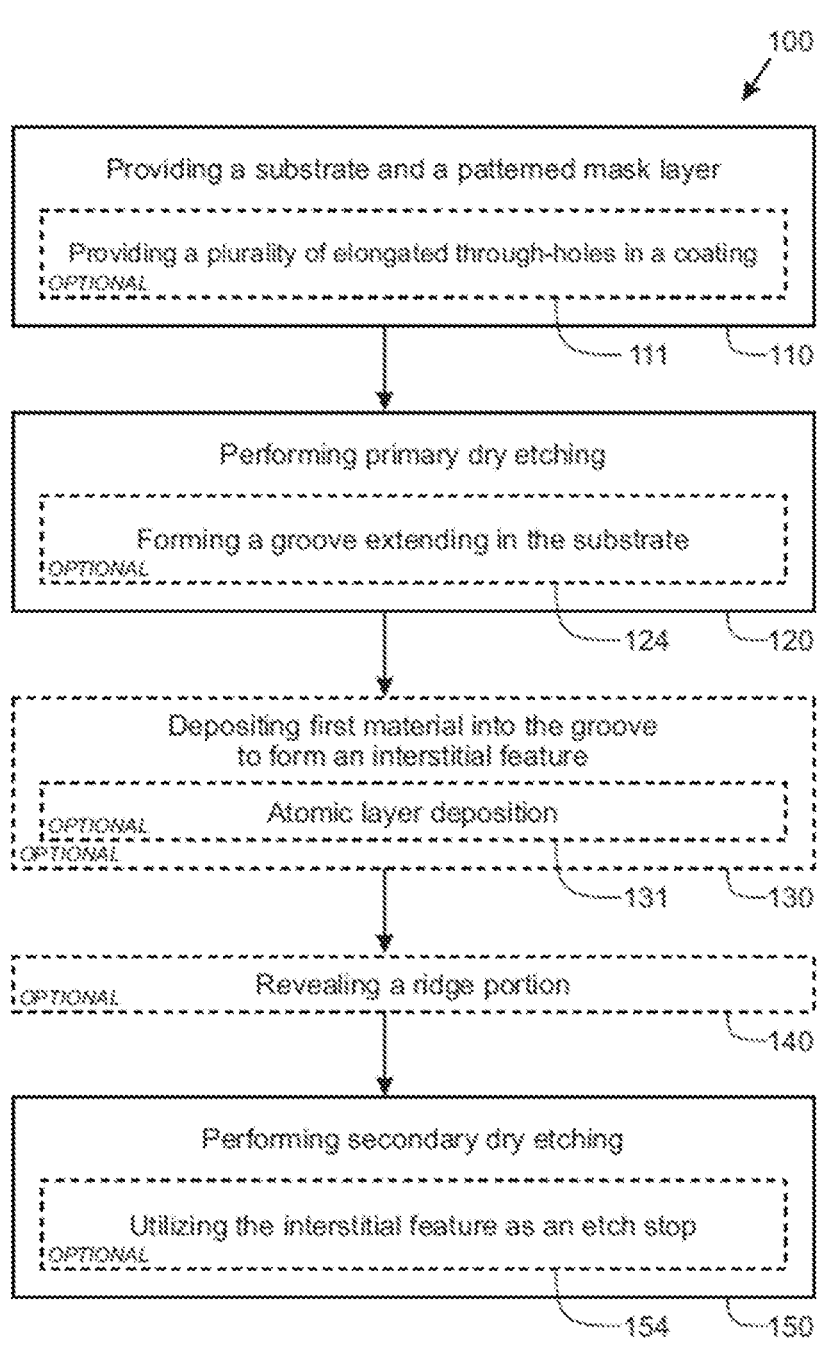
FIG. 1 illustrates a method for fabricating a blazed grating.

Unless specifically stated to the contrary, any drawing of the aforementioned drawings may be not drawn to scale such that any element in said drawing may be drawn with inaccurate proportions with respect to other elements in said drawing in order to emphasize certain structural aspects of the embodiment of said drawing.

Corresponding, e.g., identical or similar, elements of the embodiments presented in the drawings have been referred to using the same reference numbers. Corresponding elements in the aforementioned drawings may be disproportionate to each other in said drawings in order to emphasize certain structural aspects of the embodiments of said drawings.

DETAILED DESCRIPTION

FIG. 1 illustrates method 100 for fabricating a blazed grating comprising a ridge having a blaze facet facing a blaze facet direction and an anti-blaze facet facing an anti-blaze facet direction, the blaze facet direction and the anti-blaze facet direction extending along a grating cross-sectional plane. In other embodiments, a method for fabricating a blazed grating may be identical, similar, or different to the method 100 of the embodiment of FIG. 1.

In the embodiment of FIG. 1, the method 100 comprises providing a substrate and a patterned mask layer 110 on the substrate, performing primary dry etching 120 of the substrate such that primary ions are accelerated towards a primary etch direction to impinge on the substrate, and performing secondary dry etching 150 of the substrate such that secondary ions are accelerated towards a secondary etch direction to impinge on the substrate.

Throughout this specification, "dry etching" may refer to removal of material by exposure to ion bombardment. Typical dry etching techniques include Reactive Ion Etching (RIE), Deep Reactive Ion Etching (DRIE), Inductively Coupled Plasma Reactive Ion Etching (ICP-RIE), ion milling, Ion beam Etching (IBE), Reactive Ion Beam Etching (RIBE), and variants thereof.

In this specification, performing dry etching of a substrate such that specific ions are "accelerated towards" a specific direction to impinge on the substrate may refer to the ions being provided with an average velocity, e.g., a drift velocity, towards the specific direction. Typically, such ions may be accelerated towards a specific direction by an electric field.

In the embodiment of FIG. 1, a primary projection of the primary etch direction onto the grating cross-sectional plane and a secondary projection of the secondary etch direction onto the grating cross-sectional plane extend perpendicular to one and the other of the blaze facet direction and the anti-blaze facet direction, respectively, and ions (of the primary ions and the secondary ions) accelerated towards a direction with a projection onto the grating cross-sectional plane perpendicular to the blaze facet direction are collimated to form a collimated ion beam for etching the substrate. Generally, such primary etch direction and secondary etch direction and utilization of a collimated ion beam for etching a substrate perpendicular to a blaze facet direction may facilitate fabricating blazed gratings with sharper or less-rounded features, e.g., apexes and/or facets.

Herein, a "collimated ion beam" may refer to a beam of ions propagating from a collimator towards a specific etch direction, e.g., a primary etch direction or a secondary etch direction. Additionally or alternatively, an ion beam propagating from a collimator towards a specific etch direction may be referred to as a collimated ion beam, for example, if the ion beam has a maximum angular deviation from the primary etch direction of 4°, 3°, or 2°. In case a collimated ion beam is formed for etching a substrate, such maximum angular deviation may be determined at the location of the substrate.

As indicated in FIG. 1 using dashed lines, the process of performing primary dry etching 120 may optionally comprise forming a groove extending in the substrate 124 along the primary etch direction, the method 100 may optionally comprise depositing first material into the groove 130 to form an interstitial feature, and the process of performing secondary dry etching 150 may optionally comprise utilizing the interstitial feature as an etch stop 154. In general, utilization of an interstitial feature as an etch stop while performing secondary dry etching may facilitate fabrication of blazed gratings with sharper, less rounded features and/or smoother and/or more even facets. In other embodiments, a method for fabricating a blazed grating may or may not comprise one or more of such features.

In this specification, a "process" may refer to a series of one or more steps, leading to an end result. As such, a process may be a single-step or a multi-step process. Additionally, a process may be divisible to a plurality of sub-processes, wherein individual sub-processes of such plurality of sub-processes may or may not share common steps.

Herein, a "step" may refer to a measure taken in order to achieve a pre-defined result. For example, an "atomic layer deposition step" may refer to a step of a process, whereby a layer is formed by atomic layer deposition.

As again indicated in FIG. 1 using dashed lines, the method 100 may optionally comprise revealing a ridge portion 140 of the substrate prior to the process of performing secondary dry etching 150. Generally, revealing a ridge portion of a substrate prior to a process of performing secondary dry etching may facilitate forming blazed gratings without post-processing step(s), whereby portions of a substrate released during the process of performing secondary dry etching are removed. In other embodiments, a method for fabricating a blazed grating may or may not comprise revealing a ridge portion of a substrate prior to a process of performing secondary dry etching.

Further, the process of depositing first material into the groove 130 may optionally comprise an atomic layer deposition 131 step. Generally, a process of depositing first material into the groove comprising an atomic layer deposition step may facilitate forming interstitial features in narrower grooves and/or with increased uniformity. In other embodiments, a process of depositing first material into the groove may or may not comprise an atomic layer deposition step.

As also indicated in FIG. 1 using dashed lines, the process of providing a substrate and a patterned mask layer 110 may optionally comprise providing a plurality of elongated through-holes in a coating 111 arranged on the substrate to form the mask layer, the plurality of elongated through-holes extending perpendicular to the grating cross-sectional plane. In other embodiments, a process of providing a substrate and a patterned mask layer may or may not comprise providing a plurality of elongated through-holes in a coating arranged on the substrate to form the mask layer.

In an embodiment, a method for fabricating a blazed grating comprises steps implementing processes corresponding to the processes of the method 100 of the embodiment of FIG. 1. In other embodiments, a method for fabricating a blazed grating may comprise steps implementing processes corresponding to the non-optional processes of the method 100 of the embodiment of FIG. 1. In general, a method for fabricating a blazed grating may comprise any number of additional processes or steps that are not disclosed herein in connection to the method 100 of the embodiment of FIG. 1.

Steps of a method for fabricating a blazed grating implementing processes corresponding to any of the processes of the method 100 of the embodiment of FIG. 1 need not be executed in a fixed order. However, any steps implementing a process corresponding to the process of providing a substrate and a patterned mask layer 110 of the method 100 may be generally executed prior to steps implementing any process corresponding to any of the processes of performing primary dry etching 120 and performing secondary dry etching 150; any steps implementing a process corresponding to the process of forming a groove extending in the substrate 124 of the method 100 may be generally executed prior to steps implementing any process corresponding to the process of depositing first material into the groove 130; and any steps implementing a process corresponding to the process of depositing first material into the groove 130 of the method 100 may be generally executed prior to steps implementing any process corresponding to the process of utilizing the interstitial feature as an etch stop 154.

FIGS. 2A through 2E, collectively referred to throughout this specification as FIG. 2, schematically depict a series of subsequent stages of a method for fabricating a blazed grating 200, which comprises a ridge 210 having a blaze facet 211 facing a blaze facet direction 212 and an anti-blaze facet 213 facing an anti-blaze facet direction 214, the blaze facet direction 212 and the anti-blaze facet 213 extending along a grating cross-sectional plane 215, according to an embodiment. In FIG. 2, the grating cross-sectional plane 215 extends perpendicular to the plane of the drawings of FIGS. 2A through 2E. In other embodiments, a method for fabricating a blazed grating may comprise a series of stages similar or different to the stages of the method of the embodiment of FIG. 2.

The embodiment of FIG. 2 may be in accordance with any of the embodiments disclosed with reference to and/or in conjunction with FIG. 1. Additionally or alternatively, although not explicitly stated in the following, the embodiment of FIG. 2 may generally comprise any features of any of the embodiments disclosed with reference to and/or in conjunction with FIG. 1.

Figure 2A:
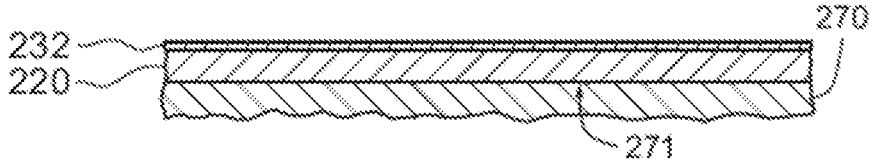
FIGS. 2A, 2B, 2C, 2D, and 2E depict a series of subsequent stages of a method for fabricating a blazed grating.
Figure 2B:
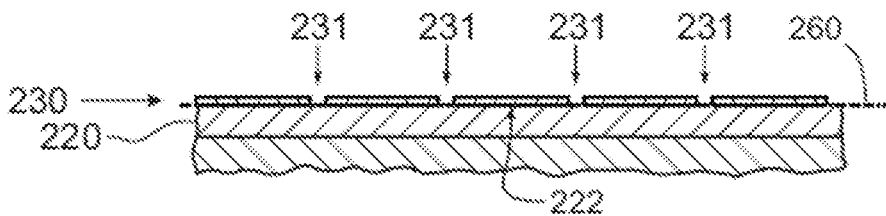
Figure 2C:
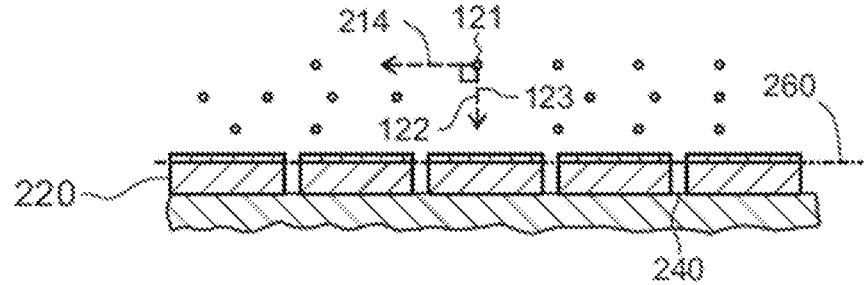
Figure 2D:
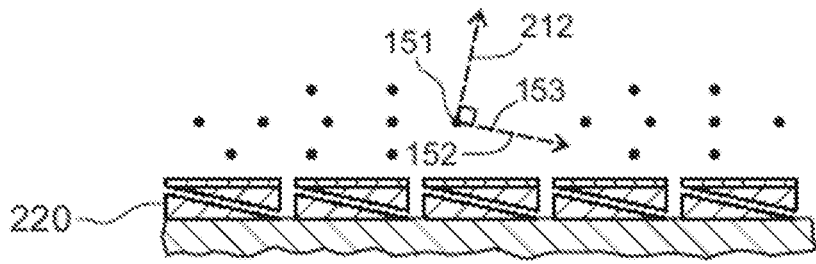
Figure 2E:

With reference to FIG. 2E, the blazed grating 200 comprises a plurality of ridges 210, each ridge of the plurality of ridges 210 having a blaze facet 211 facing the blaze facet direction 212 and an anti-blaze facet 213 facing the anti-blaze facet direction 214. In other embodiments, a blazed grating may comprise at least one such ridge or a plurality of, i.e., at least two, such ridges.

With reference to FIGS. 2A and 2B, the method comprises providing a substrate 220 and a patterned mask layer 230 on the substrate 220. The process of providing the substrate 220 and the patterned mask layer 230 comprises providing a coating 232 on the substrate 220 and providing a plurality of elongated through-holes 231 in the coating 232 to form the mask layer 230. The plurality of elongated through-holes 231 extends perpendicular to the grating cross-sectional plane 215.

The substrate 220 of the embodiment of FIG. 2 may be formed of high-refractive-index polymer material(s), using any suitable application method(s), for example, spin coating, spray coating, and/or inkjet printing. In other embodiments, a substrate may comprise any suitable material(s), which may be formed using any suitable process(es).

The mask layer 230 of the embodiment of FIG. 2 may be formed of aluminum oxide ($AlO_2$) deposited by electron beam evaporation. In other embodiments, a mask layer may comprise any suitable material(s), for example, inorganic material(s), including oxide and/or nitride material(s), such as aluminum ($AlO_2/AlO_x$), titanium oxide ($TiO_2/TiO_2$), silicon oxide ($SiO_2/SiO_x$) and/or silicon nitride ($Si_2N_3/SiN_x$), which may be formed using any suitable process(es), for example, sputtering, evaporation, Chemical Vapor Deposition (CVD), Plasma Enhanced Chemical Vapor Deposition (PECVD), Inductively Coupled Plasma Chemical Vapor Deposition (ICP-CVD), Atomic Layer Deposition (ALD), and/or variants thereof.

The method of the embodiment of FIG. 2 may constitute an example of a method for fabricating a blazed grating, whereby a blazed grating is formed onto a face of a waveguide for coupling light into the waveguide and/or out of the waveguide. As such, the substrate 220 may be arranged onto a face 271 of a waveguide 270. In other embodiments, a blazed grating may be formed for any suitable use(s) in any suitable application(s), for example, onto a face of a waveguide for coupling light into the waveguide and/or out of the waveguide.

In case the substrate 220 is arranged onto a face 271 of a waveguide 270, the blazed grating 200 of the embodiment of FIG. 2 is formed into an additional material layer arranged onto the waveguide 270. In other embodiments, wherein a blazed grating is formed onto a face of a waveguide for coupling light into the waveguide and/or out of the waveguide, said blazed grating may or may not be arranged onto such additional material layer. In some such embodiments, a blazed grating may be formed directly into a waveguide.

In this disclosure, a "waveguide" may refer to an optical waveguide. Additionally or alternatively, a waveguide may refer to a two-dimensional waveguide, wherein light may be confined along a thickness direction of said waveguide.

Further, a "face" of a waveguide may refer to a part of a surface of said waveguide viewable from or facing a certain viewing direction. Additionally or alternatively, faces of a waveguide may refer to surfaces suitable for or configured to confine light in said waveguide by total internal reflection.

With reference to FIG. 2C, the method comprises performing primary dry etching of the substrate 220 such that primary ions 121, indicated schematically by white dots, are accelerated towards a primary etch direction 122 to impinge on the substrate 220.

In the embodiment of FIG. 2, a primary projection 123 of the primary etch direction 122 onto the grating cross-sectional plane 215 extends perpendicular to anti-blaze facet direction 214. In other embodiments, a primary projection of a primary etch direction onto a grating cross-sectional plane may extend perpendicular to a blaze facet direction or an anti-blaze facet direction.

The process of performing primary dry etching of the embodiment of FIG. 2 comprises forming a groove 240 extending in the substrate 220 along the primary etch direction 122. In other embodiments, a process of performing primary dry etching may or may not comprise forming such groove.

As indicated in FIGS. 2B and 2C, an interface 222 between the substrate and the mask layer extends along a base plane 260, and the primary projection 123 extends perpendicular to the base plane 260. The base plane 260 extends perpendicular to the grating cross-sectional plane 215. Generally, a primary projection or a secondary projection extending perpendicular to a base plane may enable forming blazed gratings with upright anti-blaze facets, which may impart increased diffraction efficiency. In other embodiments, a primary projection or a secondary projection may or may not extend perpendicular to a base plane.

Herein, a "base plane" may refer to a fictitious surface along which an interface between a substrate and a mask layer extends. A base plane may be planar, for example, in case of a flat interface, or curved, for example, in case of a curved interface.

In the embodiment of FIG. 2, the primary etch direction 122 may extend parallel to the grating cross-sectional plane 215. Consequently, the primary etch direction 122 may extend perpendicular to the base plane 260. Generally, a primary etch direction or a secondary etch direction extending perpendicular to a base plane may enable utilization of a wider range of dry etching techniques, including reactive ion etching (RIE) and ion milling. In other embodiments, a primary etch direction or a secondary etch direction may or may not extend perpendicular to a base plane. For example, in some embodiments, each of a primary projection and a secondary projection may extend obliquely with respect to a base plane. Generally, a primary projection and a secondary projection extending obliquely with respect to a base plane may enable forming blazed gratings with slanted anti-blaze facets, which may, for example, facilitate spatially modulating diffraction efficiencies of the blazed gratings.

Since the primary etch direction 122 may extend perpendicular to the base plane 260, the process of performing primary dry etching of the embodiment of FIG. 2 may comprise a RIE step. During the RIE step, the substrate 220 may be etched, for example, using oxygen plasma. In other embodiments, wherein a primary etch direction or a secondary etch direction extends perpendicular to a base plane, a process of performing primary dry etching may comprise any suitable step(s), for example, a RIE step and/or an ion milling step.

With reference to FIG. 2D, the method comprises performing secondary dry etching of the substrate 220 such that secondary ions 151, indicated schematically by black dots, are accelerated towards a secondary etch direction 152 to impinge on the substrate 220.

In the embodiment of FIG. 2, a secondary projection 153 of the secondary etch direction 152 onto the grating cross-sectional plane 215 extends perpendicular to blaze facet direction 212. In other embodiments, a secondary projection of a secondary etch direction onto a grating cross-sectional plane may extend perpendicular to a blaze facet direction or an anti-blaze facet direction.

In the embodiment of FIG. 2, the secondary ions 151 are collimated to form a collimated secondary ion beam for etching the substrate 220. In other embodiments, primary ions and/or secondary ions may be collimated to form a collimated primary ion beam and/or a collimated secondary ion beam for etching a substrate.

The process of performing secondary dry etching of the embodiment of FIG. 2 may comprise a RIBE step. During such RIBE step, the substrate 220 may be etched, for example, using oxygen ions. In other embodiments, a process of performing dry etching, wherein ions are accelerated towards a direction with a projection onto a grating cross-sectional plane perpendicular to a blaze facet direction and said ions are collimated to form a collimated ion beam for etching a substrate, may comprise any suitable step(s), for example, an IBE and/or a RIBE step.

With reference to FIG. 2E, the method further comprises a post-processing step, whereby portions of the substrate 220 released during the process of performing secondary dry etching are removed to form the plurality of ridges 210. In other embodiments, a method for fabricating a blazed grating may or may not comprise such post-processing step.

The post-processing step of the embodiment of FIG. 2 may be implemented as a wet cleaning step, such as, a water immersion step. In other embodiments, wherein a method for fabricating a blazed grating comprises a post-processing step, whereby portions of a substrate released during a process of performing secondary dry etching are removed to form one or more ridges, the post-processing step may be implemented in any suitable manner, for example, as a wet cleaning step, such as, a water immersion step.

In the embodiment of FIG. 2, under primary etching conditions (i.e., in the process of performing primary dry etching), the primary ions 121 may exhibit a first primary chemical reactivity with the mask layer 230 and a second primary chemical reactivity higher than the first primary chemical reactivity with the substrate 220. Additionally, under secondary etching conditions (i.e., in the process of performing secondary dry etching), the secondary ions 151 may exhibit a first secondary chemical reactivity with the mask layer 230 and a second secondary chemical reactivity higher than the first secondary chemical reactivity with the substrate 220. Generally, utilization of such reactive ions for etching a substrate may increase selectivity of dry etching processes, which may, in turn, facilitate fabricating blazed gratings with sharper, less rounded features. Examples of dry etching techniques, wherein such reactive ions are utilized, include RIE, DRIE, ICP-RIE, RIBE and variants thereof. In other embodiments, primary ions may or may not exhibit, under primary etching conditions, a first primary chemical reactivity with a mask layer and a second primary chemical reactivity higher than the first primary chemical reactivity with a substrate, and/or secondary ions may or may not exhibit, under secondary etching conditions, a first secondary chemical reactivity with the mask layer and a second secondary chemical reactivity higher than the first secondary chemical reactivity with the substrate.

FIGS. 3A through 3H, collectively referred to throughout this specification as FIG. 3, schematically depict a series of subsequent stages of a method for fabricating a blazed grating 200 comprising a ridge 210 having a blaze facet 211 facing a blaze facet direction 212 and an anti-blaze facet 213 facing an anti-blaze facet direction 214, the blaze facet direction 212 and the anti-blaze facet 213 extending along a grating cross-sectional plane 215, according to an embodiment. In FIG. 3, the grating cross-sectional plane 215 extends perpendicular to the plane of the drawings of FIGS. 3A through 3H. In other embodiments, a method for fabricating a blazed grating may comprise a series of stages similar or different to the stages of the method of the embodiment of FIG. 3.

The embodiment of FIG. 3 may be in accordance with any of the embodiments disclosed with reference to and/or in conjunction with any of FIGS. 1 and 2. Additionally or alternatively, although not explicitly stated in the following, the embodiment of FIG. 3 may generally comprise any suitable features of any of the embodiments disclosed with reference to and/or in conjunction with any of FIGS. 1 and 2.

Figure 3A:
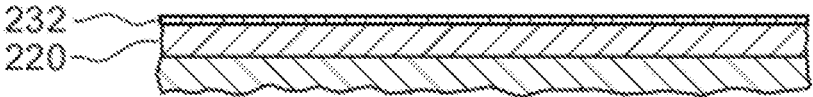
FIGS. 3A, 3B, 3C, 3D, 3E, 3F, 3G, and 3H show a series of subsequent stages of another method for fabricating a blazed grating.
Figure 3B:
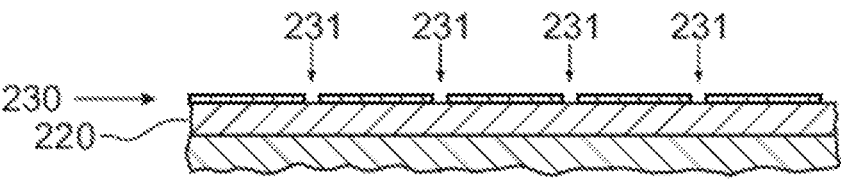
Figure 3C:
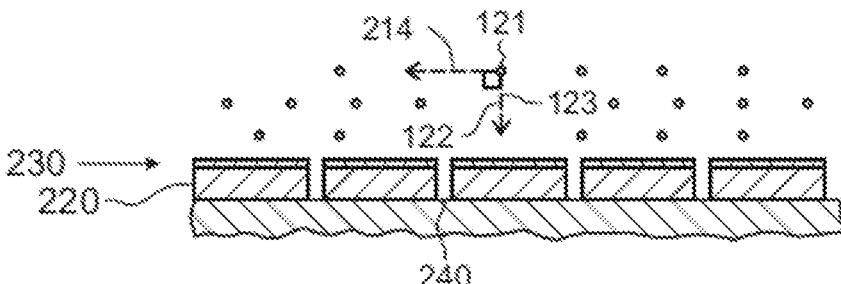

With reference to FIGS. 3A through 3C, the method comprises providing a substrate 220 and a patterned mask layer 230 on the substrate 220, comprising providing a coating 232 on the substrate 220 and providing a plurality of elongated through-holes 231 in the coating 232 to form the mask layer 230, as well as performing primary dry etching of the substrate 220 such that primary ions 121, indicated schematically by white dots, are accelerated towards a primary etch direction 122 to impinge on the substrate 220.

In the embodiment of FIG. 3, a primary projection 123 of the primary etch direction 122 onto the grating cross-sectional plane 215 extends perpendicular to anti-blaze facet direction 214. Additionally, the process of performing primary dry etching of the embodiment of FIG. 3 comprises forming a groove 240 extending in the substrate 220 along the primary etch direction 122.

As the processes of providing a substrate and a patterned mask layer and performing primary dry etching of the embodiment of FIG. 3 may be implemented in accordance with what is disclosed above with reference to FIG. 2, further details of these processes are omitted herein for brevity and conciseness.

Figure 3D:
Figure 3E:
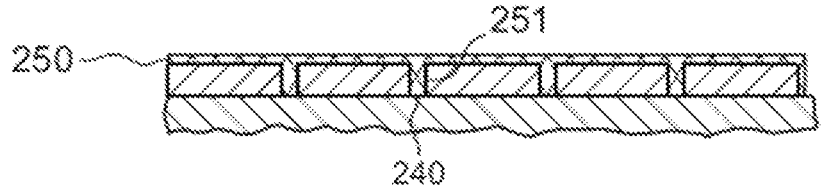

With reference to FIGS. 3D and 3E, the method comprises depositing first material 250 into the groove 240 to form an interstitial feature 251 and, prior to the process of depositing first material 250 into the groove 240, removing the patterned mask layer 230. In other embodiments, a method for fabricating a blazed grating may or may not comprise depositing first material into a groove to form an interstitial feature. In embodiments, wherein a method for fabricating a blazed grating comprises depositing first material into a groove to form an interstitial feature, the method may or may not comprise removing a patterned mask layer prior to a process of depositing first material into the groove.

The first material 250 of the embodiment of FIG. 3 may be aluminum oxide ($AlO_2$ or $AlO_x$) deposited by Plasma Enhanced Chemical Vapor Deposition (PECVD). In other embodiments, a mask layer may comprise any suitable material(s), which may be formed using any suitable process (es), for example, an oxide or a nitride material, such as aluminum oxide ($AlP_2$/$AlO_x$), titanium oxide ($TiO_2$/$TiO_2$), silicon oxide ($SiO_2$/$SiO_x$) or silicon nitride ($Si_2N_3$/$SiN_x$), or a mixture thereof. A first material may generally be deposited using any suitable deposition method(s), for example, sputtering, evaporation, Chemical Vapor Deposition (CVD), PECVD, Inductively Coupled Plasma Chemical Vapor Deposition (ICP-CVD), Atomic Layer Deposition (ALD), and/or variants thereof.

Figure 3F:

With reference to FIG. 3F, the method comprises revealing a ridge portion 221 of the substrate 220 prior to a process of performing secondary dry etching. In other embodiments, a method for fabricating a blazed grating may or may not comprise revealing a ridge portion of a substrate prior to a process of performing secondary dry etching.

In the embodiment of FIG. 3, the process of revealing the ridge portion 221 of the substrate 220 may comprise an additional dry etching step. In other words, at least part of the first material 250 covering the ridge portion 221 may be etched using dry etching methods. In other embodiments, wherein a method for fabricating a blazed grating comprises revealing a ridge portion of a substrate, said process of revealing a ridge portion may be implemented in any suitable manner.

Figure 3G:
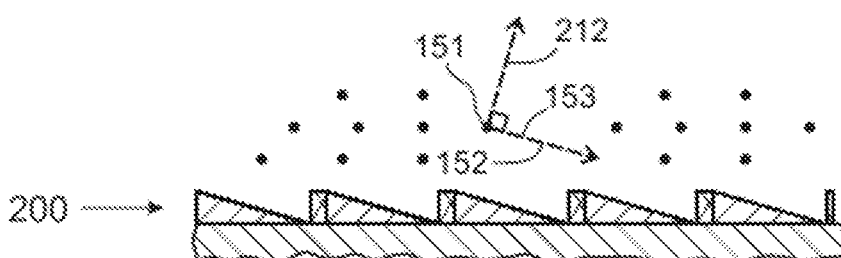

With reference to FIGS. 3G, the method comprises performing secondary dry etching of the substrate 220 such that secondary ions 151, indicated schematically by black dots, are accelerated towards a secondary etch direction 152 to impinge on the substrate 220. The secondary ions 151 are collimated to form a collimated secondary ion beam for etching the substrate 220.

In the embodiment of FIG. 3, the process of performing secondary dry etching comprises utilizing the interstitial feature 251 as an etch stop. In other embodiments, a process of performing secondary dry etching may or may not comprise utilizing the interstitial feature as an etch stop.

In the embodiment of FIG. 3, the interstitial feature 251 is arranged towards the anti-blaze facet direction 214 from the ridge portion 221. In other embodiments, an interstitial feature may be arranged towards a blaze facet direction or towards an anti-blaze facet direction from a ridge portion. In other embodiments, wherein a secondary projection of the secondary etch direction onto the grating cross-sectional plane extends perpendicular to one of the blaze facet direction and the anti-blaze facet direction, an interstitial feature may be arranged towards the other of the blaze facet direction and the anti-blaze facet direction from a ridge portion.

Figure 3H:

With reference to FIG. 3H, the method further comprises a post-processing step, whereby the interstitial feature 251 is removed. Such step may be implemented, for example, as a wet etching step. In other embodiments, a method for fabricating a blazed grating may or may not comprise such post-processing step.

FIGS. 4A through 4F, collectively referred to throughout this specification as FIG. 4, schematically depict a series of subsequent stages of a method for fabricating a blazed grating 200 comprising a ridge 210 having a blaze facet 211 facing a blaze facet direction 212 and an anti-blaze facet 213 facing an anti-blaze facet direction 214, the blaze facet direction 212 and the anti-blaze facet 213 extending along a grating cross-sectional plane 215, according to an embodiment. In FIG. 4, the grating cross-sectional plane 215 extends perpendicular to the plane of the drawings of FIGS. 4A through 4F. In other embodiments, a method for fabricating a blazed grating may comprise a series of stages similar or different to the stages of the method of the embodiment of FIG. 4.

The embodiment of FIG. 4 may be in accordance with any of the embodiments disclosed with reference to and/or in conjunction with any of FIGS. 1 to 3. Additionally or alternatively, although not explicitly stated in the following, the embodiment of FIG. 4 may generally comprise any features of any of the embodiments disclosed with reference to and/or in conjunction with any of FIGS. 1 to 3.

Figure 4A:
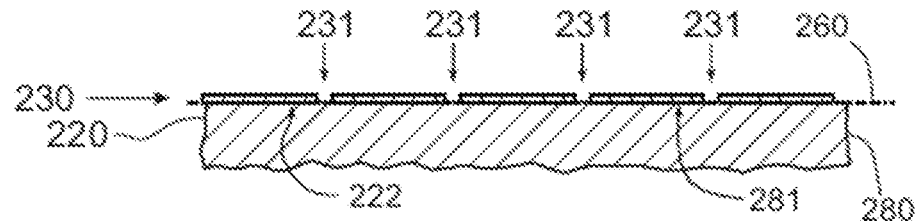
FIGS. 4A, 4B, 4C, 4D, 4E, and 4F illustrate a series of subsequent stages of yet another method for fabricating a blazed grating.

With reference to FIGS. 4A, the method comprises providing a substrate 220 and a patterned mask layer 230 on the substrate 220. The method of the embodiment of FIG. 2 may constitute an example of a method for fabricating a blazed grating, whereby the blazed grating is formed onto a contact face of a nanoimprint stamp. As such, the substrate 220 of the embodiment of FIG. 2 may be a nanoimprint stamp 280 having a contact face 281.

In the embodiment of FIG. 4, the nanoimprint stamp 280 may be formed of single-crystalline silicon. In other embodiments, a nanoimprint stamp may be formed of or comprise any suitable material(s). For example, in some embodiments, a nanoimprint stamp may comprise a plurality of stacked layers formed of different materials.

As indicated in FIG. 4A, an interface 222 between the substrate 220 and the mask layer 230 extends along a base plane 260 extending perpendicular to the grating cross-sectional plane 215.

Figure 4B:
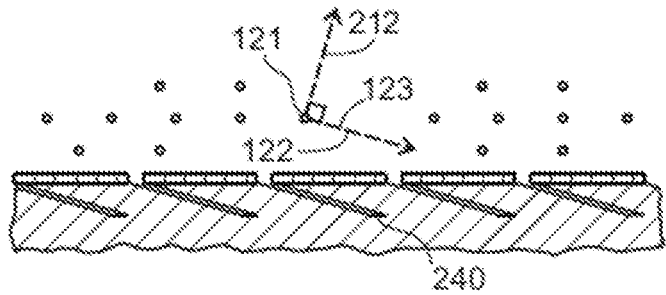

With reference to FIG. 4B, the method performing primary dry etching of the substrate 220 such that primary ions 121, indicated schematically by white dots, are accelerated towards a primary etch direction 122 to impinge on the substrate 220. In the embodiment of FIG. 4, the primary ions 121 are collimated to form a collimated primary ion beam for etching the substrate 220. In other embodiments, primary ions may or may not be collimated to form a collimated primary ion beam for etching a substrate.

In the embodiment of FIG. 4, a primary projection 123 of the primary etch direction 122 onto the grating cross-sectional plane 215 extends perpendicular to blaze facet direction 212. Additionally, the process of performing primary dry etching of the embodiment of FIG. 4 comprises forming a groove 240 extending in the substrate 220 along the primary etch direction 122.

Figure 4C:

With reference to FIG. 4C, the method comprises depositing first material 250 into the groove 240 to form an interstitial feature 251. In other embodiments, a method for fabricating a blazed grating may or may not comprise depositing first material into a groove to form an interstitial feature.

In the embodiment of FIG. 4, the process of depositing first material 250 into the groove 240 comprises an atomic layer deposition step. In other words, at least part of the first material 250 deposited into the groove 240 is deposited using atomic layer deposition. The first material 250 of the embodiment of FIG. 3 may be aluminum oxide ($AlO_2$ or $AlO_x$). In other embodiments, wherein a process of depositing first material into a groove comprises an atomic layer deposition step, any suitable type of first material may be used.

Figure 4D:
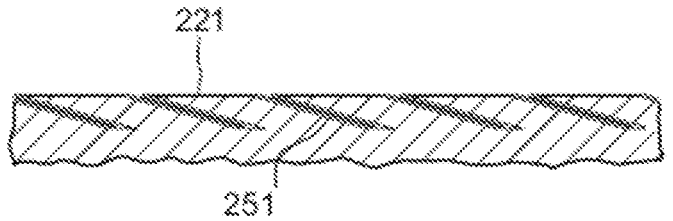

With reference to FIGS. 4D, the method comprises revealing a ridge portion 221 of the substrate 220 prior to a process of performing secondary dry etching. In the embodiment of FIG. 4, the process of revealing the ridge portion 221 of the substrate 220 may comprise, for example, a lift-off step for removing the mask layer 230 and first material 250 covering the ridge portion 221.

Figure 4E:
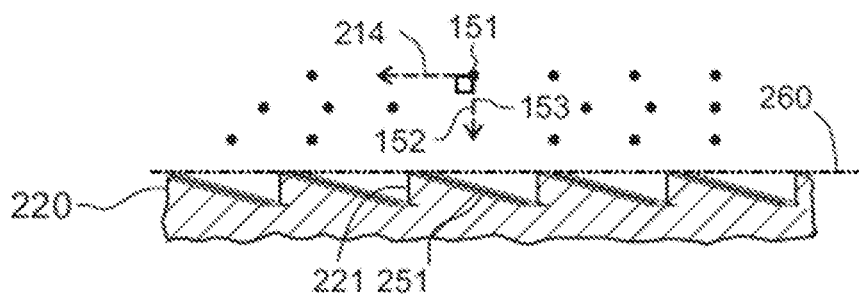
Figure 4F:

With reference to FIGS. 4E, the method comprises performing secondary dry etching of the substrate 220 such that secondary ions 151, indicated schematically by black dots, are accelerated towards a secondary etch direction 152 to impinge on the substrate 220. The process of performing secondary dry etching comprises utilizing the interstitial feature 251 as an etch stop. The interstitial feature 251 is arranged towards the blaze facet direction 212 from the ridge portion 221.

In the embodiment of FIG. 4, the secondary etch direction 152 may extend parallel to the grating cross-sectional plane 215. Consequently, the secondary etch direction 152 may extend perpendicular to the base plane 260. Since the secondary etch direction 152 may extend perpendicular to the base plane 260, the process of performing primary dry etching of the embodiment of FIG. 4 may comprise a RIE step.

Finally, with reference to FIG. 3F, the method further comprises a post-processing step, whereby the interstitial feature 251 is removed, for example, by wet etching.

It is to be understood that the embodiments described above may be used in combination with each other. Several of the embodiments may be combined together to form a further embodiment.

It is obvious to a person skilled in the art that with the advancement of technology, the basic idea of the invention may be implemented in various ways. The invention and its embodiments are thus not limited to the examples described above, instead they may vary within the scope of the claims.

It will be understood that any benefits and advantages described above may relate to one embodiment or may relate to several embodiments. The embodiments are not limited to those that solve any or all of the stated problems or those that have any or all of the stated benefits and advantages.

The term "comprising" is used in this specification to mean including the feature(s) or act(s) followed thereafter, without excluding the presence of one or more additional features or acts. It will further be understood that reference to 'an' item refers to one or more of those items.

REFERENCE SIGNS

| | |
|---|---|
| 100 method | 154 utilizing the |
| 110 providing a substrate and a patterned mask layer | interstitial feature as an etch stop |
| 111 providing a plurality of elongated through-holes in a coating | 200 blazed grating |
| | 210 ridge |
| | 211 blaze facet |
| 120 performing primary dry etching | 212 blaze facet direction |
| 121 primary ions | 213 anti-blaze facet |
| 122 primary etch direction | 214 anti-blaze facet direction |
| 123 primary projection | 215 grating cross-sectional plane |
| 124 forming a groove extending in the substrate | 220 substrate |
| 130 depositing first material into the groove | 221 ridge portion |
| | 222 interface |
| | 230 mask layer |
| 131 atomic layer deposition | 231 through-hole |
| 140 revealing a ridge portion | 232 coating |
| | 240 groove |
| 150 performing secondary dry etching | 250 first material |
| | 251 interstitial feature |
| 151 secondary ions | 260 base plane |
| 152 secondary etch direction | 270 waveguide |
| 153 secondary projection | 280 nanoimprint stamp |
| | 271 face |
| | 281 contact face |

The invention claimed is:

1. A method for fabricating a blazed grating comprising a ridge having a blaze facet facing a blaze facet direction and an anti-blaze facet facing an anti-blaze facet direction, the blaze facet direction and the anti-blaze facet direction extending along a grating cross-sectional plane, the method comprising:

providing a substrate and a patterned mask layer on the substrate, performing primary dry etching of the substrate such that primary ions are accelerated towards a primary etch direction to impinge on the substrate, and performing secondary dry etching of the substrate such that secondary ions are accelerated towards a secondary etch direction to impinge on the substrate;

wherein a primary projection of the primary etch direction onto the grating cross-sectional plane extends perpendicular to the anti-blaze facet direction and a secondary projection of the secondary etch direction onto the grating cross-sectional plane extends perpendicular to the blaze facet direction and ions accelerated towards a direction with a projection onto the grating cross-sectional plane perpendicular to the blaze facet direction are collimated to form a collimated ion beam for etching the substrate;

wherein the method comprises not revealing a ridge portion of the substrate prior to the process of performing secondary dry etching and the mask layer comprises an inorganic material.

2. The method of claim 1, wherein the process of performing primary dry etching comprises forming a groove extending in the substrate along the primary etch direction, the method comprises depositing first material into the groove to form an interstitial feature, and the process of performing secondary dry etching comprises utilizing the interstitial feature as an etch stop.

3. The method of claim 2, wherein the process of depositing first material into the groove comprises an atomic layer deposition step.

4. The method of claim 1, wherein an interface between the substrate and the mask layer extends along a base plane, and the primary projection or the secondary projection extends perpendicular to the base plane.

5. The method of claim 4, wherein the primary etch direction or the secondary etch direction extends perpendicular to the base plane.

6. The method of claim 1, wherein an interface between the substrate and the mask layer extends along a base plane, and the primary projection and the secondary projection extend obliquely with respect to the base plane.

7. The method of claim 1, wherein the process of providing a substrate and a patterned mask layer comprises providing a plurality of elongated through-holes in a coating arranged on the substrate to form the mask layer, the plurality of elongated through-holes extending perpendicular to the grating cross-sectional plane.

8. The method of claim 1, wherein, under primary etching conditions, the primary ions exhibit a first primary chemical reactivity with the mask layer and a second primary chemical reactivity higher than the first primary chemical reactivity with the substrate, and/or, under secondary etching conditions, the secondary ions exhibit a first secondary chemical reactivity with the mask layer and a second secondary chemical reactivity higher than the first secondary chemical reactivity with the substrate.

9. The method of claim 1, wherein the blazed grating is formed onto a face of a waveguide for coupling light into the waveguide and/or out of the waveguide.

10. The method of claim 1, wherein the blazed grating is formed onto a contact face of a nanoimprint stamp.

* * * * *